(12) United States Patent
Ohm et al.

(10) Patent No.: US 6,803,562 B2
(45) Date of Patent: Oct. 12, 2004

(54) INDIRECT MONITORING OF SEMICONDUCTOR LIGHT SOURCE WITHIN A PHOTONIC PACKAGE

(75) Inventors: David R. Ohm, Tigard, OR (US); Richard A. Booman, Lake Oswego, OR (US)

(73) Assignee: Network Elements, Inc., Beaverton, OR (US)

( * ) Notice: Subject to any disclaimer, the term of this patent is extended or adjusted under 35 U.S.C. 154(b) by 154 days.

(21) Appl. No.: 10/087,877

(22) Filed: Mar. 1, 2002

(65) Prior Publication Data

US 2003/0164448 A1 Sep. 4, 2003

(51) Int. Cl.[7] .............................. H01J 3/14; H01J 40/14; H01L 31/0232
(52) U.S. Cl. ..................... 250/239; 250/216; 257/432; 257/433
(58) Field of Search ................................. 250/216, 239, 250/552, 234, 235, 236; 257/431, 432, 433

(56) References Cited

U.S. PATENT DOCUMENTS

| | | | | |
|---|---|---|---|---|
| 4,854,659 A | * | 8/1989 | Hamerslag et al. | 385/14 |
| 5,019,769 A | * | 5/1991 | Levinson | 372/31 |
| 5,181,216 A | * | 1/1993 | Ackerman et al. | 372/36 |
| 5,808,293 A | * | 9/1998 | Yang | 438/57 |

* cited by examiner

Primary Examiner—David Porta
Assistant Examiner—David C. Meyer
(74) Attorney, Agent, or Firm—Schwabe, Williamson & Wyatt, P.C.

(57) ABSTRACT

A photonic package includes a housing having a semiconductor light source disposed within the housing. The semiconductor light source has a first output and a second output. A reflective surface is disposed inside the housing to reflect the second output from the semiconductor light source. A photodetector is also disposed within the housing and is adapted to indirectly receive the second output of the semiconductor light source reflected off the reflective surface. As a result, interior surface of a housing of an optical transponder may be utilized to provide reflected light to a photodetector to monitor the semiconductor light source.

16 Claims, 3 Drawing Sheets

INDIRECT MONITORING OF SEMICONDUCTOR LIGHT SOURCE WITHIN A PHOTONIC PACKAGE

FIELD OF INVENTION

The invention relates to the field of photonic packaging. More specifically, the invention relates to monitoring of a semiconductor light source within the photonic packages.

BACKGROUND OF THE INVENTION

With advances in integrated circuit, microprocessor, networking and communication technologies, an increasing number of devices, in particular, digital computing devices, are being networked together. Such devices are often first coupled to a local area network, such as an Ethernet-based office/home network. In turn, the local area networks are interconnected together through wide area networks, such as Synchronous Optical Networks (SONET), Asynchronous Transfer Mode (ATM) networks, Frame Relays, and the like. Of particular importance is the TCP/IP based global internetwork, the Internet. The rapid growth of the Internet has fueled a convergence of data communication (datacom) and telecommunication (telecom) protocols and requirements. It is increasingly important that data traffic be carried efficiently across local, regional and wide area networks.

The widespread deployment of high-speed networking and communications equipment has produced a large demand for various types of networking and communications components and subsystems. Included among these, are modules, which are often referred to as optical transponders.

Optical transponders typically include components for both electrical signal processing, and components for transmission and reception of optical signals. Conventional optical transponders typically receive data representing electrical signals in parallel, serialize the data represented, encode the serialized data onto a light-based signal, and couple that optical signal to an outbound optical fiber. Similarly, conventional optical transponders, typically receive a light-based signal having data serially encoded thereon, recover the data in an electrical form, de-serialize the data and provide them in a parallel format to a plurality of output terminals.

Conventional optical transponders typically include a case, or housing, within which the electrical and optical components are enclosed. Such a housing provides physical protection for the components therein, and also provides thermal conductivity so that heat may be dissipated from the components disposed within the case. The number of components may be numerous. However, a requirement of the housing is that the housing be of a small form factor. Accordingly, in order to have the components within a housing of a small form factor, placement of the components is an important aspect of the optical transponder.

Placement of the components may be determined by one component's operation relative to another's. For example, as described above, a component, such as a semiconductor light source, that operates to provide light-based signals is placed in such a manner as to be optically coupled to another component, such as an optical fiber, that operates to optically transmit light-based signals.

Integrity of the light-based signals and stability of the semiconductor may be based upon power output of the semiconductor light source. Accordingly, an important component of an optical transponder is semiconductor light source monitoring device, such as a photodetector, that can monitor the power output of the semiconductor light source. Due to design of a common semiconductor light source used in optical transponders, the semiconductor light source can provide light in more than one path, e.g., two light paths, simultaneously. One light path, commonly known as light source facet, is directed to the optical fiber. Another light path, commonly referred to as back facet, may be directed to a light receiving area of the photodetector. The photodetector receives the light via the light receiving area, or window, and the light is converted to electrical signals, which are sent to another component to be processed to determine the integrity of the light-based signals and stability of the semiconductor light source (i.e., optical power, temperature, and the like). This monitoring is commonly referred to as back-facet monitoring (BFM). The light source facet and the back facet are on opposite sides of each other. Accordingly, placement of the photodetector is opposite side of the semiconductor light source coupled to the optical fiber.

As the form factor of the housing of the optical transponder continues to become smaller, placement of the photodetector in the light path opposite the optical fiber side of the semiconductor light source becomes increasingly difficult due to various components included in the housing.

BRIEF DESCRIPTION OF DRAWINGS

The invention is illustrated by way of example and not by way of limitation in the figures of the accompanying drawings, in which the like references indicate similar elements and in which.

DETAILED DESCRIPTION OF THE INVENTION

The invention facilitates indirect monitoring of a semiconductor light source by a photodetector within a photonic package. In the following description, various aspects of the invention will be described. However, one skilled in the relevant art will recognize that the invention may be practiced without one or more of the specific details, or with other methods, materials, components, etc. In other instances, well-known structures, materials, or operations are not shown or described in detail to avoid obscuring aspects of various embodiments of the invention. Similarly, for purposes of explanation, specific numbers, materials and configurations are set forth in order to provide a thorough understanding of the invention. Nevertheless, the invention may be practiced without the specific details. In other instances, well-known features are omitted or simplified in order not to obscure the invention. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily all referring to the same embodiment or invention. Furthermore, the particular features, structures, materials, or characteristics may be combined in any suitable manner in one or more embodiments.

For the purposes of describing the invention, lightwaves will be illustrated as straight lines. However, one skilled in the relevant art will appreciate that lightwaves may behave as waves or particles. Additionally, certain established principles of physics will not be described in detail, in particular, derivations of equations such as those describing the behavior of semiconductors and the like will not be described in detail. However, relevant equations will be described but not derived.

Accordingly, the concept of data carried by lightwaves will not be described in detail. However, for the purposes of the invention, the concept of utilizing different wavelengths of lightwaves to carry different data will be referred to in describing the invention.

Figure 1:
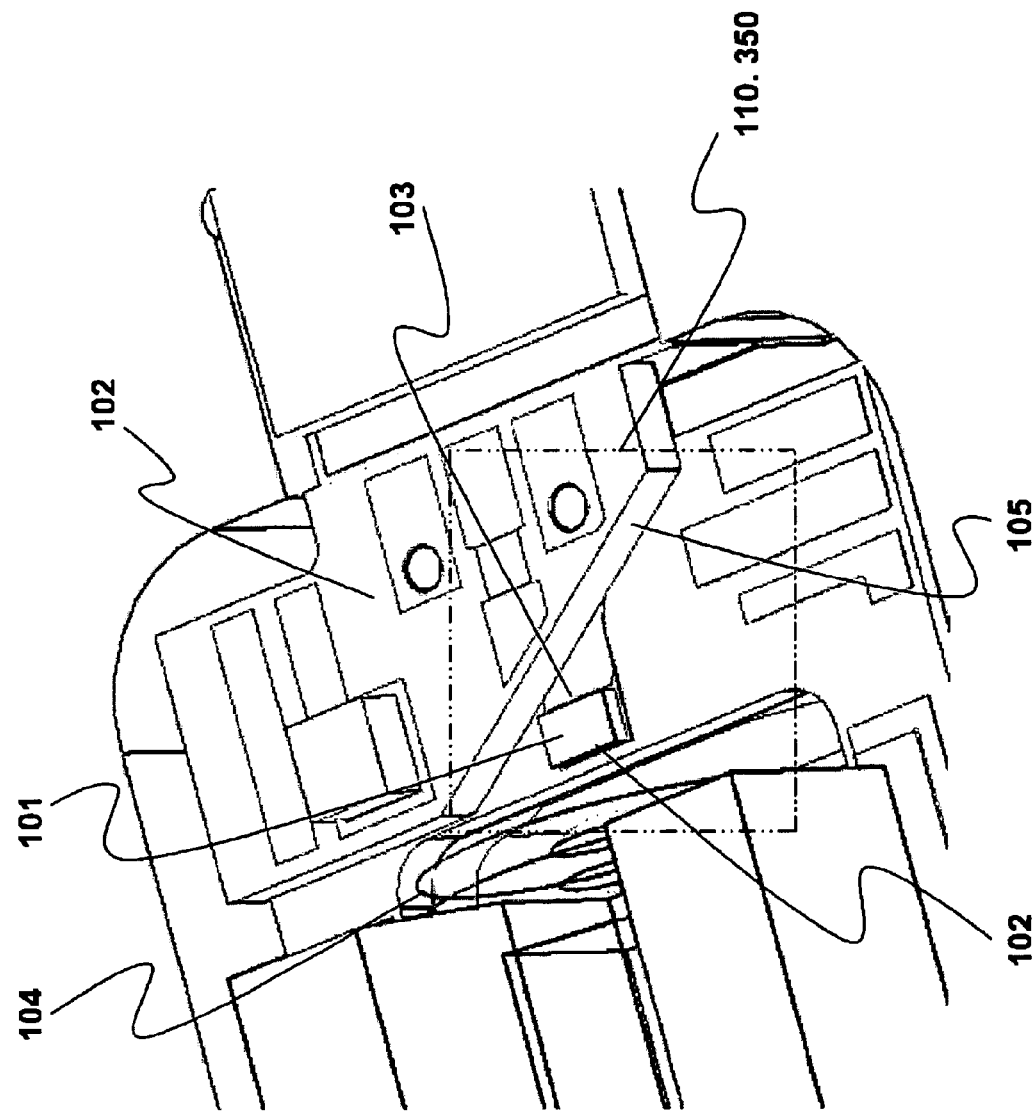
FIG. 1 illustrates an example photonic package, more specifically, an optical transponder, with which an embodiment of the invention may be practiced.

FIG. 1 illustrates an example photonic package, more specifically, an optical transponder with which an embodiment of the invention may be practiced. Illustrated in FIG. 1 is a perspective view of a portion of the optical transponder, in particular, a housing 100 of the optical transponder with its cover (shown as ref. 310 in FIG. 3) removed exposing various components of the optical transponder. In the interior of the housing 100 is illustrated a light source 101 having a rectangular shape. The light source may be a semiconductor light source, such as, but not limited to, a Gallium arsenide (GaAs) laser. On one side of the semiconductor light source 101, are optical components, such as but not limited to, focusing lenses 104 for focusing a first light output of the semiconductor light source 101 to be provided to an optical fiber (not shown). For ease of understanding, this side will be referred to the front side of the semiconductor light source 101. On the opposite side (or the back side) of the semiconductor light source 101 is a substrate 102 having various components mounted on it. The elevation of the substrate 102 is higher than the semiconductor light source 101. More importantly, substrate 102 is disposed right next to semiconductor light source 101, thereby resulting in one of its side surface 105 serving as a "back wall" for the semiconductor light source 101. Further, in accordance with the present invention, side surface or back wall 105 is angularly disposed, relative to the back light facet of semiconductor light source 101.

For the illustrated embodiment, substrate 102, when viewed from the top, is substantially trapezoidal in shape, with side surface 105 being the surface disposed on an angular side of the trapezoidal substrate 102. In alternate embodiments, substrates of other shapes may be employed, including but not limited to triangle, rectangle, and polygon, so long as the disposition orientation of the substrate results in its surface of the side next to semiconductor light source 101 being angularly disposed relative to the back light facet of semiconductor light source 101. Further, back wall 105 may be provided by other non-substrate component, to be described in further detail below.

Figure 2:
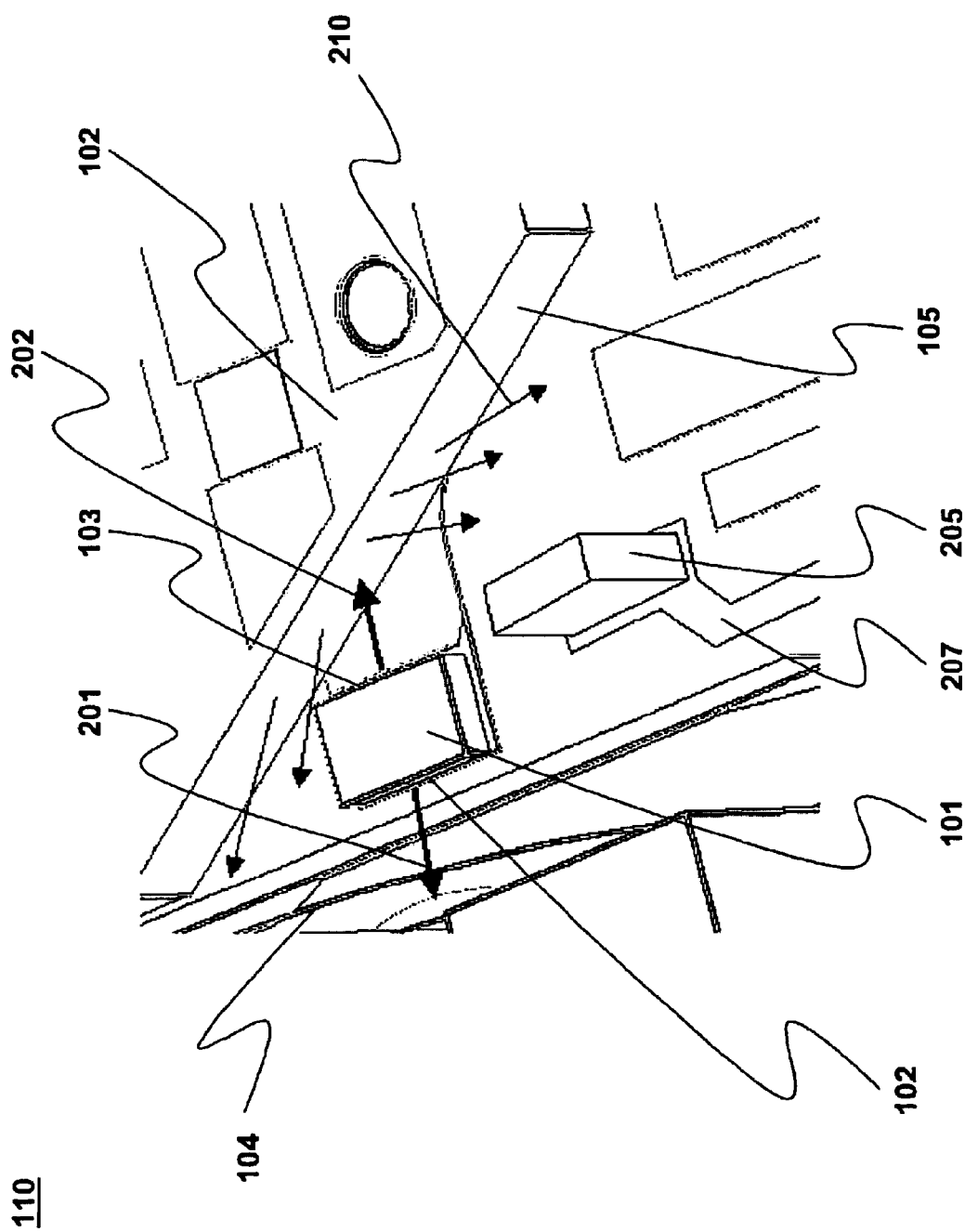
FIG. 2 illustrates indirect monitoring of a semiconductor light source by a photodetector within a photonic package, in accordance with one embodiment of the invention.

Continuing to refer to FIG. 1, as alluded to earlier, the semiconductor light source 101 is positioned in such a manner as to have a light source facet (front facet) 102 providing a first output (shown as ref. 202 in FIG. 2). Opposite the front facet 102, the semiconductor light source 101 has a back facet 103 facing towards the back wall 105 providing a second output. As illustrated in FIG. 1, space within a housing of a photonic package, such as the illustrated optical transponder, can be very limited due to various components and form factor requirements (i.e., numerous components while small form factor).

In order to describe the invention, references will be made to an exemplary area 110 & 350 (an area around the semiconductor light source).

FIG. 2 illustrates indirect monitoring of a semiconductor light source by a photodetector within a photonic package, in accordance with one embodiment of the invention. Illustrated in FIG. 2 is a view of the exemplary area 110 (shown in FIG. 1). In FIG. 2, semiconductor light source 101 provides a first output 201 from the front facet 102. As alluded to earlier, in FIG. 2, the first output 201 may be directed towards focusing lenses 104 for focusing light to be provided to the optical fiber (not shown). Also illustrated in FIG. 2 is second output 202 from the back facet 103. Semiconductor light source 101 may be a semiconductor laser, in which case, the first and second outputs 201–202 may each be coherent laser light. Accordingly, illustrated in FIG. 2, when the second output 202 is incident on the surface or back wall 105 angularly disposed relative to the second output 202, the second output 202 may be reflected by the surface or back wall 105. The resultant illustrated as reflected light 210. In FIG. 2, the outputs 201–202 and the reflected light 210 are illustrated visually as different lights. However, it should be appreciated by those skilled in the relevant art, that the visual difference is only for ease of understanding the invention, and does not represent differences in the light.

Illustrated also in FIG. 2 is a photodetector 205 of the photonic package positioned to receive the reflected light from surface or back wall 105, in accordance with one embodiment of the invention. The photodetector 205 may be a photodiode, such as, but not limited to, p-layer, intrinsic layer, and n-layer (p-i-n) junction photodiode, an Schottky photodiode, or an avalanche photodetector. As illustrated in FIG. 2, the photodetector 205 is positioned in a coordinated manner relative to the angular surface or wall 105, such that it may receive reflected light 210 from the interior surface 105. The reflected light 210 may be received by the photodetector 205 through a window (shown as ref. 331 in FIG. 3) of the photodetector 205. Accordingly, as illustrated in FIG. 2, the window 331 of the photodetector faces angular surface or back wall 105. Additionally, illustrated in FIG. 2, the photodetector 205 is disposed on a tracing 207 to facilitate transmission of electrical signals output by the photodetector 205 responsive to the received reflected light to a processor (not shown). The photodetector 205 is adapted to produce an electrical signal responsive to the reflected light based at least on properties of the photodetector 205 such as, but not limited to, spectral responsivity, external quantum efficiency, noise, response time, dark current, and junction capacitance.

For example, the photodetector 205 may be a p-i-n junction photodiode, where spectral responsivity may be expressed as $$R = \frac{I}{L} \qquad \text{Equation 1}$$

In Equation 1, I is amperes of current generated by the photodetector 205, and L is power of incident light, the reflected light 210, measured in watts. R is responsivity in units of amperes per watt. Furthermore, external quantum efficiency of a photodiode is its capability to convert light energy to electrical energy (i.e., electrical signals), and can be expressed as a relation to responsivity as $$EQE(\lambda) = \frac{I(\lambda)hc}{\Phi(\lambda)ne\lambda}, \quad \text{Equation 2}$$

where EQE ($\lambda$) is external quantum efficiency as function of wavelength, I is photocurrent (output current—dark output current) as function wavelength, h is Planck's constant, c is velocity of light, $\Phi$ is input radiant flux (power), n is index of refraction of air, e is elementary charge, and $\lambda$ is wavelength of light in units of nanometers. Accordingly, the Equation 1 and Equation 2 can be utilized to form the relationship $$EQE(\lambda) = 1239\frac{R}{\lambda}, \quad \text{Equation 3}$$

where R and $\lambda$, as defined earlier, are responsivity in units of amperes per watt and wavelength of light in units of nanometers, respectively.

The electrical signals may be provided to the processor wherein the electrical signals may be compared to characterization data. The characterization data may relate electrical signals from the photodetector 205 produced by reflected 210 light received by the photodetector 205 of the first output 201 of the light source 101. For example, referring to FIG. 2, characterization data may be produced by having several data points corresponding to power of light of the first output 201 from the front facet 102 as compared to power of light of the reflected light 210. The processor has at least access to the characterization data to facilitating calibration of the reflected light 210 by the photodetector 205. Affects, such as, but not limited to, temperature may also be accounted for during the calibration process. Accordingly, as the processor receives the electrical signals from the photodetector 205, the processor may facilitate adjustments to bias voltages of the photodetector 205 to ensure proper monitoring of the semiconductor light source 101.

As a result, a photodetector can be adapted to receive light reflected from a surface of a component disposed at the back of the semiconductor light source, housed inside a densely populated housing of an optical transponder, thereby advantageously monitoring a semiconductor light source from locations other than those that are directly behind the semiconductor light source (i.e., the photodetector is not required to be in direct path of the back output of the semiconductor light source).

Figure 3A:
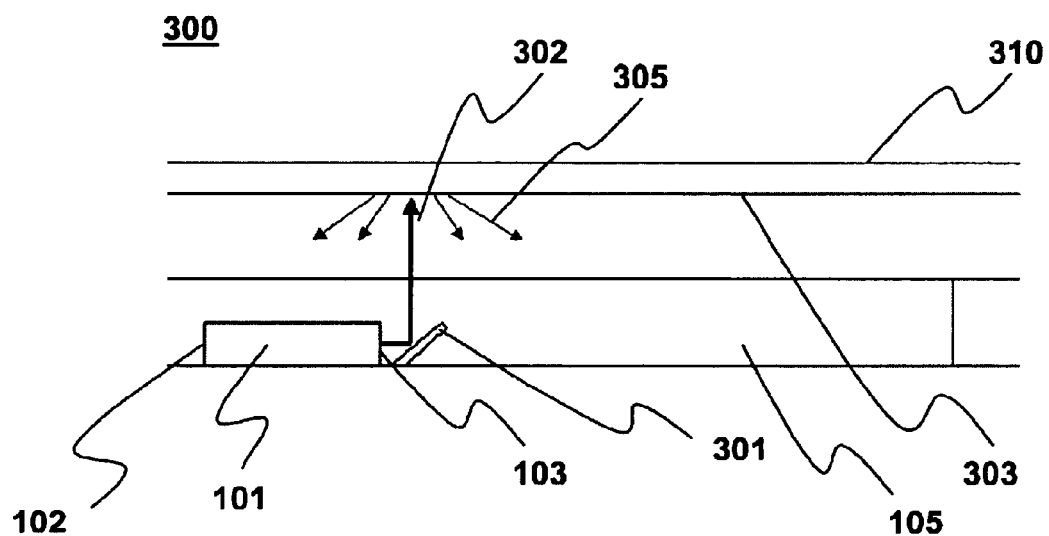
FIGS. 3A–3B illustrate indirect monitoring of a semiconductor light source by a photodetector within a photonic package, in accordance with an alternate embodiment of the invention.
Figure 3B:
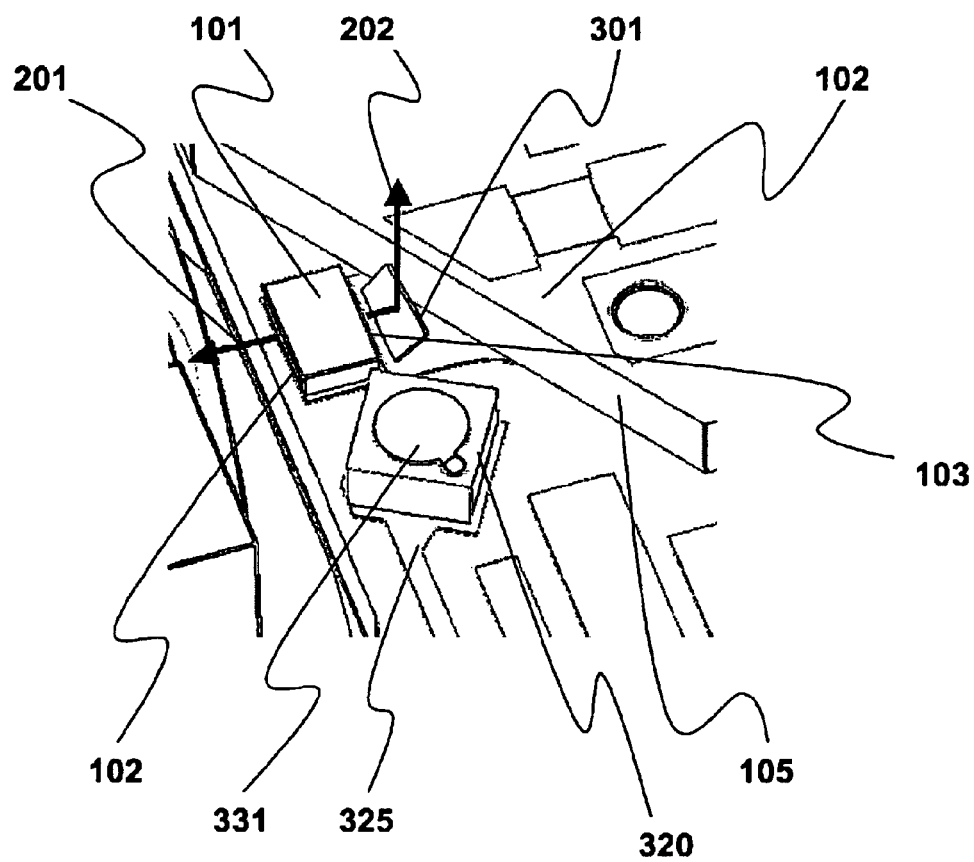

FIGS. 3A–3B illustrate indirect monitoring of a semiconductor light source by a photodetector of a photonic package, in accordance with an alternate embodiment of the invention. Illustrated in FIG. 3A is a side view 300 of the housing 100 (shown in FIG. 1) with its cover 310 covering the various components within the housing 100. Commonly, the cover 310, walls (not shown) and floor (not shown) aids in forming a hermetic seal to prevent outside influences, such as, particulate, humidity, etc. In the alternate embodiment illustrated in FIG. 3A, a reflective mirror surface 301 is provided to deflect the second output 202 from the back facet 103 of the semiconductor light source 101 to an interior surface of the cover 303. Accordingly, the deflected second output 202 incidences on the interior surface of the cover 303, reflecting off the surface, and forming cover reflected light 305.

In one embodiment, the interior surface of the cover 303 may have a coating to help facilitate cover reflected light 305, such as, but not limited to, paint having a pigment of titanium dioxide (i.e., white paint).I In one embodiment, the reflective mirror surface 301 may be a highly polished silicon mirror or a dielectric coating. In alternative embodiments, it may be a reflective sheet or stripe.

FIG. 3B is a perspective view of the exemplary area 350 illustrating an alternately adapted photodetector to receive light reflected from the interior surface of the cover 303, in accordance with the alternate embodiment of FIG. 3A. As illustrated in FIG. 3B, the alternately adapted photodetector 320 has it window 331 facing the interior surface of the cover 303 in a coordinated manner to receive the cover reflected light 305.

Alternatively, in one embodiment, the reflective mirror surface 301 may be disposed in such a manner as to reflect the second output 202 from the back facet 103 of the light source 101 to one or more other secondary reflective surfaces, such as, but not limited to, a side wall of housing (not shown). For these embodiments, the photodetector will be adapted accordingly in a coordinated manner to receive light reflected from the alternate secondary reflective wall by positioning the receiving window of the photodetector to face the alternate secondary reflective wall.

As a result, alternate interior surfaces of a housing of an optical transponder may be utilized to provide reflected light to a photodetector adapted to receive the reflected light.

Thus, it can be seen from the above descriptions, a novel method and apparatus for indirect monitoring of a light source by a photodetector, has been described.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. Thus, the description is to be regarded as illustrative instead of restrictive on the invention.

What is claimed is:

1. A photonic package comprising:
   a housing;
   a semiconductor light source disposed within the housing, the semiconductor light source having a first output and a second output;
   a first reflective surface disposed inside the housing selected from one of a side wall of the housing and an interior surface of a cover of the housing to reflect said second output;
   a second reflective surface to deflect the second output to the first reflective surface; and
   a photodetector disposed within the housing adapted to indirectly receive said second output of the semiconductor light source reflected off said first reflective surface.

2. The photonic package of claim 1, wherein the photonic package comprises an optical transponder.

3. The photonic package of claim 1, wherein the first reflective surface comprises an exterior surface of an elevated substrate angularly disposed relative to the second output, to reflect said second output to said photodetector.

4. The photonic package of claim 1, wherein the second reflective surface comprises a reflective mirror to angularly reflect the second output.

5. The photonic package of claim 4, wherein the first reflective surface is optically coupled to said reflective mirror to further reflect the second output to said photodetector.

6. The photonic package of claim 1, wherein the first output is provided from a front facet of the semiconductor light source.

7. The photonic package of claim 1, wherein the second output is provided from a back facet of the semiconductor light source.

8. The photonic package of claim 1, wherein the photodetector comprises a photodiode.

9. The photonic package of claim 8, wherein the photodiode comprises a p-i-n junction photodiode.

10. The photonic package of claim 1, wherein said first reflective surface comprises a reflective coating.

11. The photonic package of claim 10, wherein the reflective coating comprises paint having a pigment of titanium dioxide.

12. A method for forming a photonic package comprising:

providing a semiconductor light source to provide a first and a second output;

providing a first reflective surface to reflect the second output of the semiconductor light source, wherein said providing of a first reflective surface comprises providing a reflective interior surface to a housing of the photonic package;

providing a second reflective surface and disposing said second reflective surface in a manner such that said second reflective surface reflects said second output of the semiconductor light source to said reflective interior surface of the housing, for reflection to said photodetector; and adapting a photodetector to indirectly receive the second output of the semiconductor light source reflected from the interior surface.

13. The method of claim 12, wherein said providing of a reflective surface comprises providing a substrate having an angular exterior surface, and the method further comprises disposing said substrate in a manner such that said angular exterior surface of the substrate reflects said second output of the semiconductor light source to said photodetector.

14. The method of claim 12, wherein said providing of a second reflective surface comprises of providing a mirror and disposing said mirror in a manner such that said mirror reflects said second output of the semiconductor light source to said reflective interior surface of the house, for reflection to said photodetector.

15. The photonic package of claim 14, wherein said at least one of said first and said second reflective surfaces comprises a mirror.

16. A photonic package comprising:

a housing;

a semiconductor light source disposed within the housing, the semiconductor light source having a first output and a second output;

a first reflective surface disposed inside the housing to reflect said second output;

a second reflective surface to deflect the second output to the first reflective surface, at least one of said first and said second reflective surfaces is selected from one of a side wall of the housing and an interior surface of a cover of the housing; and a photodetector disposed within the housing adapted to indirectly receive said second output of the semiconductor light source reflected off said first reflective surface.

* * * * *